United States Patent
Ide et al.

(10) Patent No.: US 7,558,029 B2
(45) Date of Patent: Jul. 7, 2009

(54) MAGNETIC DETECTIBLE HEAD COMPRISING FREE LAYER

(75) Inventors: Yosuke Ide, Niigata-ken (JP);
Masamichi Saito, Niigata-ken (JP);
Masahiko Ishizone, Niigata-ken (JP);
Naoya Hasegawa, Niigata-ken (JP)

(73) Assignee: TDK Corporation, Tokyo (JP)

( * ) Notice: Subject to any disclaimer, the term of this patent is extended or adjusted under 35 U.S.C. 154(b) by 426 days.

(21) Appl. No.: 11/364,533

(22) Filed: Feb. 27, 2006

(65) Prior Publication Data
US 2006/0198061 A1    Sep. 7, 2006

(30) Foreign Application Priority Data
Mar. 3, 2005    (JP)    ............... 2005-058729

(51) Int. Cl.
*G11B 5/127* (2006.01)
(52) U.S. Cl. ............................... 360/324.12
(58) Field of Classification Search ............. 360/324.12
See application file for complete search history.

(56) References Cited

U.S. PATENT DOCUMENTS

| | | | | |
|---|---|---|---|---|
| 5,992,004 A * | 11/1999 | Sato et al. | ................ | 29/603.14 |
| 6,157,524 A * | 12/2000 | Nakazawa et al. | ..... | 360/324.12 |
| 6,661,624 B1 * | 12/2003 | Nagasaka | ............... | 360/324.12 |
| 6,929,959 B2 * | 8/2005 | Nishiyama et al. | ............. | 438/3 |
| 7,029,771 B2 * | 4/2006 | Hasegawa et al. | ........ | 428/811.5 |
| 7,079,362 B2 * | 7/2006 | Hasegawa | ................ | 360/324.12 |
| 7,150,092 B2 * | 12/2006 | Hasegawa | ................ | 29/603.09 |
| 2001/0009063 A1 * | 7/2001 | Saito et al. | ................ | 29/603.08 |
| 2002/0044394 A1 * | 4/2002 | Hasegawa | ................ | 360/324.1 |
| 2002/0055016 A1 | 5/2002 | Hiramoto et al. | | |
| 2004/0067389 A1 * | 4/2004 | Hasegawa et al. | ........... | 428/692 |
| 2004/0214353 A1 * | 10/2004 | Nishiyama et al. | ............. | 438/3 |

FOREIGN PATENT DOCUMENTS

JP    2002-204010    7/2002

* cited by examiner

*Primary Examiner*—Allen T Cao
(74) *Attorney, Agent, or Firm*—Brinks Hofer Gilson & Lione

(57) ABSTRACT

There is provided a magnetic detecting element having a large ΔRA. A free magnetic layer has a three layer structure in which a CoFe layer, an $Ni_aFe_b$ alloy layer (where a and b are represented by at %, $0 \leq a \leq 25$, and a+b=100), and a CoFe layer are laminated from the bottom. If the at % of Ni in an NiFe alloy that exists in the free magnetic layer is in this range, a spin-dependent bulk scattering coefficient β increases, and the product ΔRA of the resistance variation of the magnetic detecting element and the area of the element can be made increased.

10 Claims, 5 Drawing Sheets

MAGNETIC DETECTIBLE HEAD COMPRISING FREE LAYER

BACKGROUND OF THE INVENTION

1. Field of the Invention

The present invention relates to a CPP (current perpendicular to the plane) type magnetic detecting element that allows a sense current to flow in a direction perpendicular to the surface of a film, and more specifically, to a magnetic detecting element that can make greater the product ΔRA of the resistance variation and area of the element.

2. Description of the Related Art

FIG. 5 is a partially cross-sectional view of a conventional magnetic detecting element (spin valve type thin film element) when it is cut from the direction parallel to a surface facing a recording medium.

Reference numeral 1 shown in FIG. 5 is a foundation layer made of Ta, and a seed layer 2 made of a metal having a bcc structure (body-centered cubic structure), such as Cr, is formed on the foundation layer 1.

On the seed layer 2, a multilayer film T in which an antiferromagnetic layer 3, a fixed magnetic layer 4, a nonmagnetic material layer 5, a free magnetic layer 6, and a protective layer 7 are laminated sequentially is formed.

The protective layer 7 is formed of Ta, the nonmagnetic material layer 5 is formed of Cu, the free magnetic layer 6 and the fixed magnetic layer 4 are formed of an NiFe alloy, and the antiferromagnetic layer 3 is formed of PtMn.

Electrode layers 10 and 10 are provided on the top and bottom sides of the multilayer film T, and a sense current as a direct current is allowed to flow in a direction perpendicular to the surface of the multilayer film.

An exchange-coupling magnetic field is generated at the interface between the antiferromagnetic layer 6 and the fixed magnetic layer 5, and magnetization of the fixed magnetic layer 5 is fixed in a height direction (Y-direction).

Hard bias layers 8 made of a hard magnetic material, such as CoPt, are formed on opposite sides of the free magnetic layer 6, and the top, bottom, and end of each hard bias layer 8 are insulated by an insulating layer 9. Magnetized directions of the free magnetic layer 3 are arranged in a track width direction (X-direction in the drawing) by a longitudinal bias electric field from the hard bias layers 8.

If an external magnetic field is applied to the magnetic detecting element shown in FIG. 5, the magnetized direction of the free magnetic layer changes relatively with respect to the magnetized direction of the fixed magnetic layer, and the resistance value of the multilayer film changes. When a sensing current with a fixed current value is flowing, the external magnetic field is detected by detecting the change of the resistance value as a voltage change.

In many cases, a permalloy having an excellent soft magnetic property was used as a material of the free magnetic layer of the magnetic detecting element. Further, an example of the magnetic detecting element having a free magnetic layer made of an NiFe alloy other than the permalloy is described (see JP-A-2002-204010 (US Pub. No. 2002/0055016)).

The permalloy is an NiFe alloy containing Ni of about 80 at %. Further, in JP-A-2002-204010 (US Pub. No. 2002/0055016), in Paragraph 0023, the free magnetic layer is formed of an $Ni_xFe_{(100-x)}$ alloy ($40 \leq X \leq 70$).

However, even if the free magnetic layer is formed using the NiFe alloy in this range of composition, it was difficult to control the product ΔRA of the resistance variation of a CPP (Current Perpendicular to the Plane)—GMR magnetic detecting element in which a sensing current as a direct current is allowed to flow perpendicularly to the surface of the multilayer film, and the area of the element so as to be 5 mΩμm² or more. As a result, a practical producing output cannot be obtained.

SUMMARY OF THE INVENTION

The invention has been made to solve the above conventional problems. It is therefore the object of the invention to provide a magnetic detecting element with high reproducing output by presenting preferable configuration conditions of a free magnetic layer.

According to an aspect of the invention, there is provided a magnetic detecting element including a multilayer film provided with a fixed magnetic layer of which magnetized direction is fixed in one direction and a free magnetic layer formed above the fixed magnetic layer with a nonmagnetic material layer therebetween, and allowing a current to flow in a direction perpendicular to a film surface of each layer of the multilayer film. The free magnetic layer has an $Ni_aFe_b$ alloy layer (a and b are represented by at %, $0<a\leq 25$, and $a\leq b\leq 100$).

In the aspect of the invention, the free magnetic layer is formed as a layer having an NiFe alloy layer. However, the at % of Ni and Fe of the NiFe alloy is different from a conventional at %. That is, in the aspect of the invention, the at % of Ni in the NiFe alloy is greater than 0 at %, and not more than 25 at %.

By adopting the composition of the NiFe alloy in this range, in the aspect of the invention, the product ΔRA of the resistance variation of the magnetic detecting element and the area of the element can be 5 mΩμm² or more.

Preferably, the free magnetic layer has an $Ni_aFe_b$ alloy layer (a and b are represented by at %, $2\leq a\leq 24$, and $a+b=100$). If the at % of Ni in the NiFe alloy is in this range, the product ΔRA of the resistance variation of the magnetic detecting element, and the area of the element can be made greater than a conventional ΔRA.

In the aspect of the invention, preferably, the free magnetic layer has a three layer structure in which CoFe layers are laminated on the upper side and lower side of the $Ni_aFe_b$ alloy layer.

Preferably, the fixed magnetic layer includes a $CO_2YZ$ alloy layer (Y is one or more elements selected from a group consisting of Mn, Fe, and Cr, and Z is one or more elements selected from a group consisting of Al, Ga, Si, Ge, Sn, In, Sb, Pb, and Zn).

The magnetic detecting element according to the invention is, for example, a top spin valve type CPP-GMR magnetic detecting element in which the fixed magnetic layer is provided above the free magnetic layer.

Alternatively, the magnetic detecting element is a bottom spin valve type CPP-GMR magnetic detecting element in which the fixed magnetic layer is provided below the free magnetic layer.

Alternatively, the magnetic detecting element is a dual spin valve type CPP-GMR magnetic detecting element in which the nonmagnetic material layer and the fixed magnetic layer are provided under the free magnetic layer, and another nonmagnetic material layer and another fixed magnetic layer are provided above the free magnetic layer.

For example, when the antiferromagnetic layer is superimposed on the fixed magnetic layer, the magnetized direction of the fixed magnetic layer is fixed.

In the aspect of the invention, the product ΔRA of the resistance variation of the magnetic detecting element and the area of the element can be increased by making the at % of Ni in the NiFe alloy of the free magnetic layer greater than 0 at % and 25 at % or less.

DESCRIPTION OF THE PREFERRED EMBODIMENT

Figure 1:
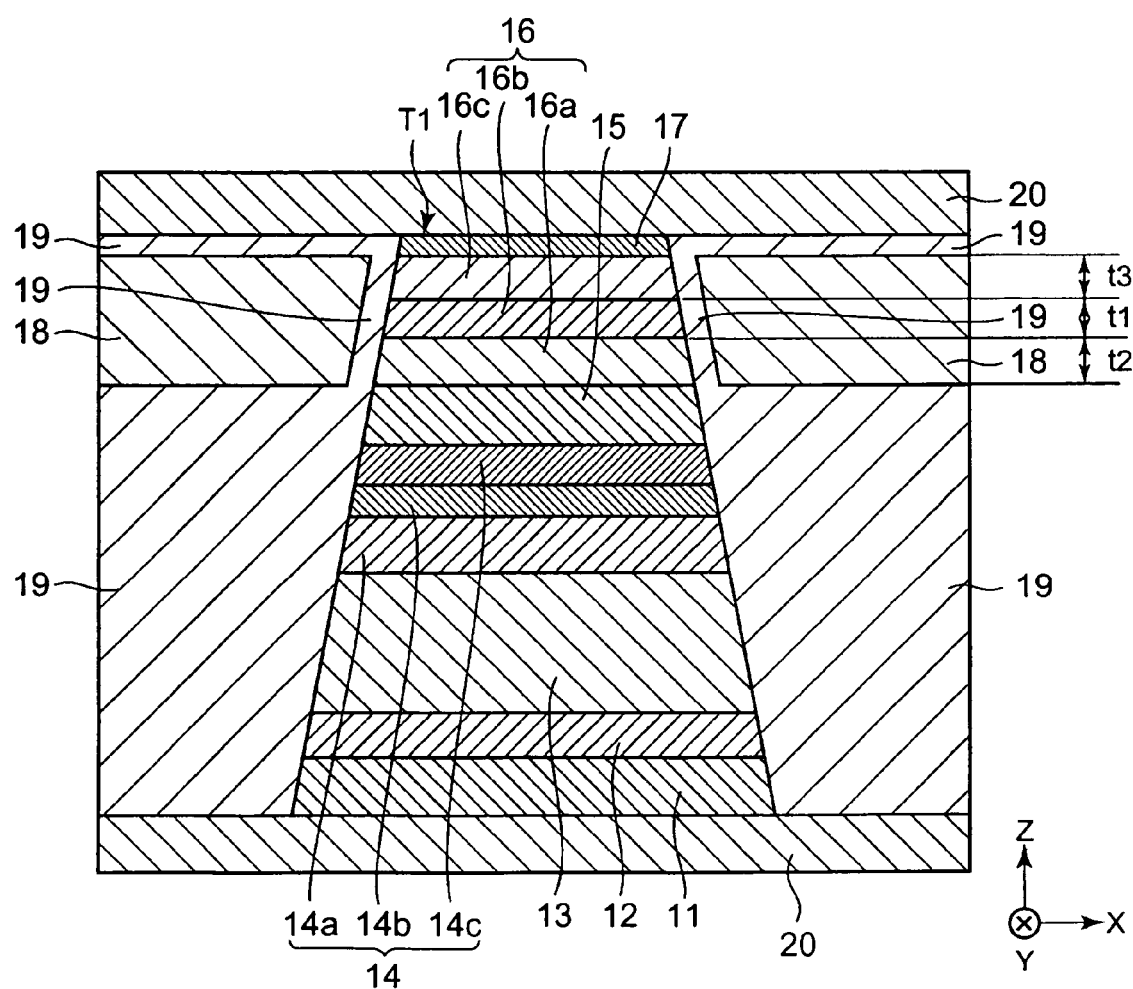
FIG. 1 is a cross-sectional view of the structure of a magnetic detecting element (single spin valve type magnetoresistance effect element) according to a first embodiment of the invention when viewed from a surface facing a recording medium.

FIG. 1 is a cross-sectional view of the entire structure of a magnetic detecting element (single spin valve type magnetoresistance effect element) according to the first embodiment of the invention when viewed from a surface facing a recording medium. In addition, FIG. 1 shows only a middle portion of the element extending in the X-direction in the drawing, of which a part is broken away.

This single spin valve type magnetoresistance effect element is provided at a trailing end, etc., of a floating-type slider provided in a hard disk drive to detect a recording magnetic field, of a hard disk, etc. In addition, the direction of movement of a magnetic recording medium, such as a hard disk, is the Z-direction, and the direction of a leakage magnetic field from the magnetic recording medium is the Y-direction in the drawing.

A foundation layer 11 formed of nonmagnetic material, such as one or more elements selected from a group consisting of Ta, Hf, Nb, Zr, Ti, Mo, and W, is formed at the bottom of FIG. 1. A multilayer film T1 composed of a seed layer 12, an antiferromagnetic layer 13, a fixed magnetic layer 14, a nonmagnetic material layer 15, a free magnetic layer 16, and a protective layer 17 is laminated on the foundation layer 11. The magnetic detecting element shown in FIG. 1 is a so-called bottom spin valve type GMR magnetic detecting element in which the antiferromagnetic layer 13 is formed under the free magnetic layer 16.

The seed layer 12 is formed of NiFeCr or Cr. If the seed layer 12 is formed of NiFeCr, the seed layer 12 has a face-centered cubic (fcc) structure in which an equivalent crystal face expressed as the {111} plane in a direction parallel to a film surface is preferentially oriented. Also, if the seed layer 12 is formed of Cr, the seed layer 12 has a body-centered cubic (bcc) structure in which an equivalent crystal plane expressed as the {110} plane in a direction parallel to a film surface is preferentially oriented.

In addition, although the foundation layer 11 has a nearly amorphous structure, the foundation layer 11 does not need to be formed.

Preferably, the antiferromagnetic layer 13 formed on the seed layer 12 is formed of an antiferromagnetic material containing an element X (where X is one or more elements selected from a group consisting of Pt, Pd, Ir, Rh, Ru, and Os) and Mn.

The antiferromagnetic layer 13 is a layer having a face-centered cubic (fcc) structure, or a layer having a face-centered tetragonal (fct) structure.

An X—Mn alloy using these platinum group elements has excellent corrosion resistance, high blocking temperature, and excellent properties as an antiferromagnetic material that can make an exchange-coupling magnetic field (Hex) stronger. For example, a PtMn alloy or an IrMn alloy formed of a binary system can be used.

Further, in the invention, the antiferromagnetic layer 13 may be formed of antiferromagnetic material containing an element X, an element X' (where the element X' is Ne, Ar, Kr, Xe, Be, B, C, N, Mg, Al, Si, P, Ti, V, Cr, Fe, Co, Ni, Cu, Zn, Ga, Ge, Zr, Nb, Mo, Ag, Cd, Sn, Hf, Ta, W, Re, Au, Pb, and one or more elements selected from a group consisting of rare earth elements), and Mn.

In addition, it is preferable to use the element X', which enters interstitially to a space of a space lattice consisting of the element X and Mn or that substitutes with some of lattice points of a crystal lattice consisting of the element X and Mn. Here, the solid solution means solids in which ingredients are uniformly mixed over a wide range.

In addition, in the invention, the preferable composition range of the element X' is 0.2 to 10 at % (i.e., atomic %), more preferably, 0.5 to 5 at %. Further, in the invention, the element X is preferably Pt or Ir.

Further, in the invention, it is preferable to set the at % of the elements X or X+X' of the antiferromagnetic layer 13 to 45 (at %) or more and 60 (at %) or less. It is more preferably 49 (at %) or more and 56.5 (at %) or less. As a result, it is estimated that, during a film forming step, an interface between the antiferromagnetic layer 13 and the fixed magnetic layer 14 is non-aligned. Also, the antiferromagnetic layer 13 causes suitable disordered state to ordered state transformation by heat treatment.

The fixed magnetic layer 14 is a three layer structure composed of a magnetic layer 14a, a nonmagnetic intermediate layer 14b, and a magnetic layer 14c. The magnetized direction of the magnetic layer 14a and the magnetized direction of the magnetic layer 14c are made anti-parallel to each other by the exchange-coupling magnetic field at the interface with the antiferromagnetic layer 13 and an antiferromagnetic exchange-coupling magnetic field (RKKY interaction), with the nonmagnetic intermediate layer 14b therebetween. This state is called an artificial ferrimagnetic coupling state. This configuration can stabilize magnetization of the fixed magnetic layer 14 and can apparently increase the exchange-coupling magnetic field. The exchange-coupling magnetic field, generated at the interface between the fixed magnetic layer 14 and the antiferromagnetic layer 13.

Here, the fixed magnetic layer 14 may be formed as a monolayer structure of a magnetic material layer, or a multi-layer structure of a magnetic material layer.

In addition, the magnetic layer 14a has a thickness of about 15 Å to 35 Å, the nonmagnetic intermediate layer 14b has a thickness of about 8 Å to 10 Å, and the magnetic layer 14c has a thickness of about 20 Å to 50 Å.

The nonmagnetic intermediate layer 14b is formed of a nonmagnetic conductive material, such as Ru, Rh, Ir, Cr, Re, and Cu.

In addition, the magnetic layer 14c of the fixed magnetic layer 14 is preferably a $CO_2YZ$ alloy layer (Y is one or more elements selected from a group consisting of Mn, Fe, and Cr, and Z is one or more elements selected from a group consisting of Al, Ga, Si, Ge, Sn, In, Sb, Pb, and Zn). The $CO_2YZ$ alloy layer is a material that has a half-metallic property and that is effective to make the product ΔRA greater. The product ΔRA is of the resistance variation ΔR of a CPP-GMR magnetic detecting element, and the area A of the element.

The nonmagnetic material layer 15 formed on the fixed magnetic layer 14 is formed of Cu, Au, or Ag.

Moreover, the free magnetic layer 16 is formed on the nonmagnetic material layer 15. The structure of the free magnetic layer 16 will be described below.

In the embodiment shown in FIG. 1, hard bias layers 18 are formed on opposite sides of the free magnetic layer 16. Magnetized directions of the free magnetic layer 16 are arranged in a track width direction (the X-direction in the drawing) by a lengthwise bias magnetic field of the hard bias layers 18 and 18. The hard bias layers 18 and 18 are formed of, for example, a Co—Pt (cobalt-platinum) alloy, a Co—Cr—Pt (cobalt-chromium-platinum) alloy, etc.

The top, bottom and end of each of the hard bias layers 18 are insulated by insulating layers 19 and 19 made of alumina, etc.

The electrode layers 20 are provided on an upper and lower side of the multilayer film T1, and they form part of CPP (Current Perpendicular to the Plane)—GMR magnetic detecting elements in which a sense current is allowed to flow perpendicularly to the film surface of each layer constituting the multilayer film T1.

The electrode layers 20 are formed of α—Ta, Au, Cr, Cu (copper), Rh, Ir, Ru, W (tungsten), etc.

This embodiment will be described.

The free magnetic layer 16 has a three layer structure in which a CoFe layer 16a, an $Ni_aFe_b$ alloy layer 16b (where a and b are represented by at %, $0<a\leq25$, and $a+b=100$), and a CoFe layer 16c are laminated from the bottom.

By adopting the composition of the NiFe alloy in this range, the product ΔRA of the resistance variation of the magnetic detecting element and the area of the element can be made increased.

Further, a and b representing the at % of Ni and Fe of the $Ni_aFe_b$ alloy layer 16b are preferably $2\leq a\leq24$ and $a+b=100$.

Although described in greater detail below, if the at % of Ni in the NiFe alloy that exists in the free magnetic layer 16 is in this range, a spin-dependent bulk scattering coefficient β increases, and the product ΔRA of the resistance variation of the magnetic detecting element and the area of the element can be greater than a conventional ΔRA.

The CoFe layer 16a and CoFe layer 16c laminated on the upper and lower side of the $Ni_aFe_b$ alloy layer 16b are provided to prevent diffusion of the NiFe alloy, and to reduce magnetostriction of the whole free magnetic layer 16. In addition, if only the CoFe layer 16a in contact with the nonmagnetic material layer 15 is formed in the case of the single spin valve type GMR magnetic detecting element shown in FIG. 1, the diffusion of the NiFe alloy to the nonmagnetic material layer 15 can be prevented, and the magnetostriction of the whole free magnetic layer 16 can be reduced. Further, the CoFe layers 16a and 16c may not be formed, but the free magnetic layer 16 may be a monolayer structure consisting of only the $Ni_aFe_b$ alloy layer 16b.

In addition, the film thickness t1 of the $Ni_aFe_b$ alloy layer 16b is preferably 20 Å or more and 90 Å or less, and the film thickness t2 of the CoFe layer 16a and the film thickness t3 of the CoFe layer 16c is preferably 3 Å or more and 15 Å or less.

In the spin valve type thin film element shown in FIG. 1, heat treatment is performed after the protective layer 17 is laminated on the underlying structure, and thereby an exchange-coupling magnetic field is generated at the interface between the antiferromagnetic layer 13 and the fixed magnetic layer 14. By directing the magnetic field in the direction parallel to the Y-direction in the drawing at this time, magnetization of the fixed magnetic layer 14 is directed and fixed in the direction parallel to the Y-direction in the drawing. In addition, in the embodiment shown in FIG. 1, since the fixed magnetic layer 14 is an artificial ferrimagnetic structure, if the magnetic layer 14a is magnetized in the Y-direction in the drawing, the magnetic layer 14c is magnetized in the opposite direction to the Y-direction in the drawing.

In the magnetic detecting element shown in FIG. 1, magnetization of the fixed magnetic layer and magnetization of the free magnetic layer are in an orthogonal relation. A leakage magnetic field from the recording medium enters into the magnetic detecting element in the Y-direction in the drawing, magnetization of the free magnetic layer changes with good sensitivity, electric resistance changes in relation to the change of the magnetized direction and the fixed magnetized direction of the fixed magnetic layer, and the leakage magnetic field from the recording medium is detected by a voltage change or current change on the basis of the change of the electric resistance value.

Figure 2:
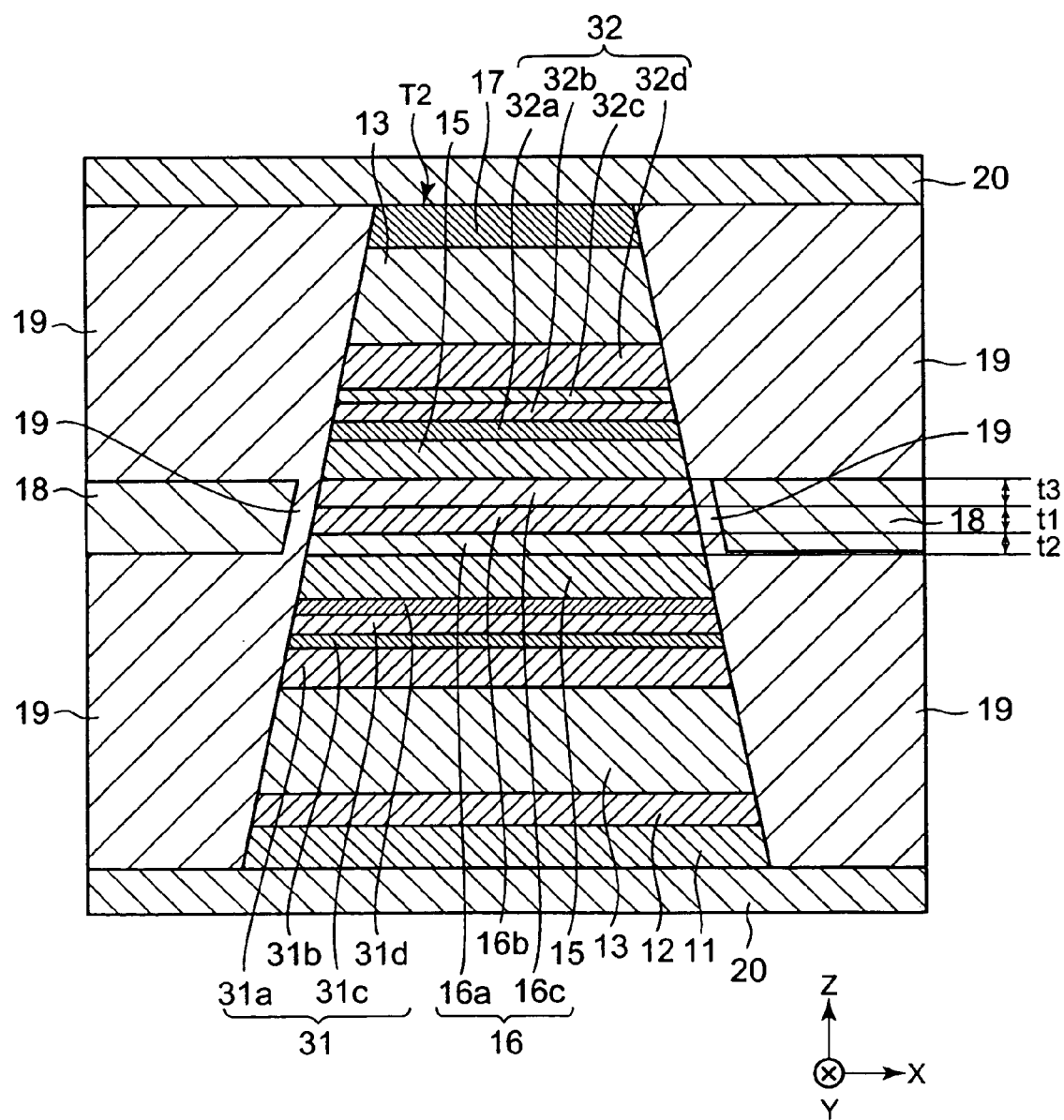
FIG. 2 is a cross-sectional view of the structure of a magnetic detecting element (dual spin valve type magnetoresistance effect element) according to a second embodiment of the invention when viewed from a surface facing a recording medium.

FIG. 2 is a partially cross-sectional view showing the structure of a dual spin valve type magnetic detecting element according to the invention.

As shown in FIG. 2, a foundation layer 11, a seed layer 12, an antiferromagnetic layer 13, a fixed magnetic layer 31, a nonmagnetic material layer 15, and a free magnetic layer 16 are continuously laminated from the bottom. Moreover, on the free magnetic layer 16, a nonmagnetic material layer 15, a fixed magnetic layer 32, an antiferromagnetic layer 13, and a protective layer 17 are laminated continuously, thereby forming a multilayer film T2.

Further, hard bias layers 18 and 18 are laminated on opposite sides of the free magnetic layer 16. The hard bias layers 18 and 18 are insulated by insulating layers 19 and 19 made of alumina, etc.

The electrode layers 20 and 20 are provided on an upper side and lower side of the multilayer film T2, and they form part of CPP (Current Perpendicular to the Plane)—GMR magnetic detecting elements in which a sense current is allowed to flow perpendicularly to the film surface of each layer constituting the multilayer film T2.

In addition, the layers in FIG. 2 to which the same reference numerals as those in FIG. 1 are given are formed of the same material.

The fixed magnetic layer 31 of the magnetic detecting element shown in FIG. 2 is a four-layer structure composed of a magnetic layer 31a, a nonmagnetic intermediate layer 31b, a magnetic layer 31c, and a Heusler alloy layer 31d. The magnetic layer 31a and the magnetic layer 31c are formed of a ferromagnetic material, such as CoFe, and the Heusler alloy layer 31d is formed of an Heusler alloy as will be described below. The Heusler alloy layer 31d has a ferromagnetic property, and the magnetic layer 31c and the Heusler alloy layer 31d have the same magnetized direction by ferromagnetic coupling.

The magnetized direction of the magnetic layer 31a is anti-parallel with the magnetized directions of the magnetic layer 31c and the Heusler alloy layer 31d by the exchange-coupling magnetic field at the interface between the antiferromagnetic layer 13 and the fixed magnetic layer 31 and by the antiferromagnetic exchange-coupling magnetic field (RKKY interaction) around the nonmagnetic intermediate layer 31b between the magnetic layer 31a and the magnetic layer 31c.

If the Heusler alloy layer 31d is provided in the fixed magnetic layer 31 of the CPP-GMR magnetic detecting element and the Heusler alloy layer 32a is provided in the fixed magnetic layer 32, the variation in the spin diffusion length or mean free path of conduction electrons within the multilayer film T2 before and after an external magnetic field is applied becomes large. That is, the variation in the resistance value of the multilayer film T2 becomes large, and the detection sensitivity of the external magnetic field improves. Further, although the Heusler alloy layer 31d may be laminated under the nonmagnetic intermediate layer 31b or on the nonmagnetic intermediate layer 32c, since the layer that touches the nonmagnetic material layer 15 contributes to a magnetoresistance effect, it is more effective to laminate the Heusler alloy layer 31d on the upper side of the nonmagnetic intermediate layer 31b or on the lower side of the nonmagnetic intermediate layer 32c.

In addition, the Heusler alloy layer 31d is preferably a $Co_2YZ$ alloy layer (Y is one or more elements selected from a group consisting of Mn, Fe, and Cr, and Z is one or more elements selected from a group consisting of Al, Ga, Si, Ge, Sn, In, Sb, Pb, and Zn). The $Co_2YZ$ alloy layer is a material that has a half-metallic property and that is effective to increase the product ΔRA. The ΔRA is of the resistance variation ΔR of the CPP-GMR magnetic detecting element, and the area A of the element.

More preferably, the Heusler alloy layer 31d is formed of metallic compounds expressed by the following composition formula: $Co_2MnZ$. Here, Z is one or more elements selected from a group consisting of Al, Ga, Si, Ge, Sn, In, Sb, Pb, and Zn.

The fixed magnetic layer 32 of the magnetic detecting element shown in FIG. 2 is a four-layer structure consisting of a Heusler alloy layer 32a, a magnetic layer 32b, a nonmagnetic intermediate layer 32c, and a magnetic layer 32d. The magnetic layer 32b and the magnetic layer 32d are formed of ferromagnetic material, such as CoFe, and the Heusler alloy layer 32a is formed of the same Heusler alloy as the Heusler alloy that forms the Heusler alloy layer 31d of the above-mentioned fixed magnetic layer 31. The magnetic layer 32b has a ferromagnetic property, and the Heusler alloy layer 32a and the magnetic layer 32b have the same magnetized direction by ferromagnetic coupling.

The magnetized direction of the magnetic layer 32d is anti-parallel with the magnetized directions of the magnetic layer 32b and the Heusler alloy layer 32a by the exchange-coupling magnetic field at the interface between the antiferromagnetic layer 13 and the fixed magnetic layer 32 and by the antiferromagnetic exchange-coupling magnetic field (RKKY interaction) around the nonmagnetic intermediate layer 32c between the magnetic layer 32b and the magnetic layer 32d.

In addition, the fixed magnetic layer 31 and the fixed magnetic layer 32 may be formed as a structure that does not have an artificial ferrimagnetic structure. Further, the fixed magnetic layer 31 shown in FIG. 2 may be used instead of the fixed magnetic layer 14 of the magnetic detecting element of FIG. 1.

Also in this embodiment, the free magnetic layer 16 has a three layer structure in which a CoFe layer 16a, an $Ni_aFe_b$ alloy layer 16b (where a and b are represented by at %, $0<a\leq25$, and a+b=100), and a CoFe layer 16c are laminated from the bottom.

By adopting the composition of the NiFe alloy in this range, according to the invention, the product ΔRA of the resistance variation of the magnetic detecting element and the area of the element can be 5 mΩμm² or more.

Further, a and b representing the at % of Ni and Fe of the $Ni_aFe_b$ alloy layer 16b are preferably $2<a\leq24$ and a+b=100.

If the at % of Ni in the NiFe alloy that exists in the free magnetic layer 16 is in this range, a spin-dependent bulk scattering coefficient β increases, and the product ΔRA of the resistance variation of the magnetic detecting element and the area of the element can be made greater than a conventional ΔRA.

The CoFe layer 16a and CoFe layer 16c laminated on upper side and lower side of the $Ni_aFe_b$ alloy layer 16b are provided to prevent diffusion of an NiFe alloy, and to reduce magnetostriction of the whole free magnetic layer 16. Further, the CoFe layers 16a and 16c may not be formed, but the free magnetic layer 16 may be a monolayer structure consisting of only the $Ni_aFe_b$ alloy layer 16b.

In addition, the film thickness t1 of the $Ni_aFe_b$ alloy layer 16b is preferably 20 Å or more and 90 Å or less, and the film thickness t2 of the CoFe layer 16a and the film thickness t3 of the CoFe layer 16c are preferably 3 Å or more and 15 Å or less.

In the spin valve type thin film element shown in FIG. 2, heat treatment is performed after the protective layer 17 is laminated on the modifying structure and thereby an exchange-coupling magnetic field is generated at the interface between the antiferromagnetic layer 13 and the fixed magnetic layers 31 and 32. By directing the magnetic field in the direction parallel to the Y-direction in the drawing at this time, magnetization of the fixed magnetic layers 31 and 32 is directed and fixed in the direction parallel to the Y-direction in the drawing. In addition, in the embodiment shown in FIG. 2, the fixed magnetic layers 31 and 32 have an artificial ferrimagnetic structure.

In the magnetic detecting element shown in FIG. 2, magnetization of the fixed magnetic layer and magnetization of the free magnetic layer are in an orthogonal relation. A leakage magnetic field from the recording medium enters into the magnetic detecting element in the Y-direction in the drawing, magnetization of the free magnetic layer changes with good sensitivity, electric resistance changes in relation to the change of the magnetized direction and the fixed magnetized direction of the fixed magnetic layer, and the leakage magnetic field from the recording medium is detected by a voltage change or current change on the basis of the change of the electric resistance value. In the dual spin valve type magnetic detecting element shown in FIG. 2, the fixed magnetic layer 32 and the fixed magnetic layer 31 are formed on an upper side and lower side of the free magnetic layer 16 with the antiferromagnetic layer 15 therebetween. Thus, theoretically, the product ΔRA of the resistance variation ΔR and the area A of the element can be doubled with respect to the single spin valve type magnetic detecting element shown in FIG. 1. In the case of the magnetic detecting element according to this embodiment, it is possible to set ΔRA of the magnetic detecting element to 5 mΩμm² or more.

Figure 3:
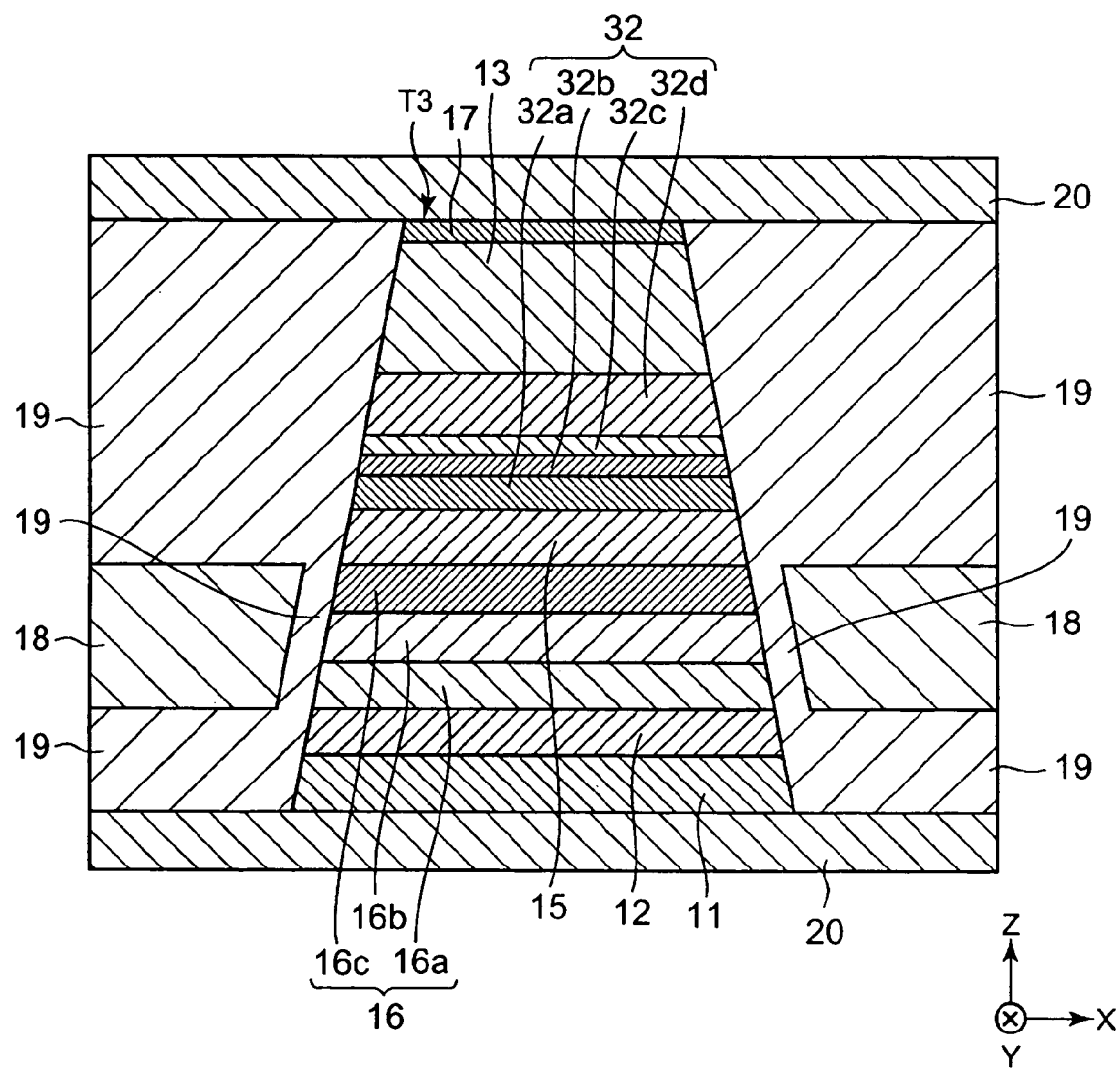
FIG. 3 is a cross-sectional view of the structure of a magnetic detecting element (single spin valve type magnetoresistance effect element) according to a third embodiment of the invention when viewed from a surface facing a recording medium.

FIG. 3 is a partially cross-sectional view showing the structure of a top spin valve type magnetic detecting element according to the invention.

As shown in FIG. 3, the foundation layer 11, the seed layer 12, the free magnetic layer 16, the nonmagnetic material layer 15, the fixed magnetic layer 32, an antiferromagnetic layer 13, and the protective layer 17 are continuously laminated from the bottom, thereby forming a multilayer film T3.

Further, hard bias layers 18 and 18 are laminated on opposite sides of the free magnetic layer 16. The hard bias layers 18 and 18 are insulated by insulating layers 19 and 19 made of alumina, etc.

The electrode layers 20 and 20 are provided on an upper side and lower side of the multilayer film T3, and they form part of CPP (Current Perpendicular to the Plane)-GMR magnetic detecting elements in which a sense current is allowed to flow perpendicularly to the film surface of each layer constituting the multilayer film T3.

In addition, the layers in FIG. 3 to which the same reference numerals as those in FIGS. 1 and 2 are given are formed of the same material.

Also in this embodiment, the free magnetic layer 16 has a three layer structure in which a CoFe layer 16a, an $Ni_aFe_b$ alloy layer 16b (where a and b are represented by at %, $0<a\leq25$, and a+b=100), and a CoFe layer 16c are laminated from the bottom.

By adopting the composition of the NiFe alloy in this range, the product ΔRA of the resistance variation of the magnetic detecting element and the area of the element can be increased.

Further, a and b representing the at % of Ni and Fe of the $Ni_aFe_b$ alloy layer 16b are preferably $2\leq a\leq24$ and a+b=100.

If the at % of Ni in the NiFe alloy that exists in the free magnetic layer 16 is in this range, a spin-dependent bulk scattering coefficient β increases, and the product ΔRA of the resistance variation of the magnetic detecting element and the area of the element can be made greater than the conventional ΔRA.

In addition, in FIGS. 1 to 3, the magnetized direction of the fixed magnetic layers 14, 31, and 32 was fixed by the exchange-coupling magnetic field at the interface with the antiferromagnetic layer 13. However, the antiferromagnetic layer 13 cannot be superimposed on the fixed magnetic layers 14, 31, and 32, but it is possible to adopt a fixed magnetic layer of a self-pinning structure in which the magnetized direction of the fixed magnetic layers 14, 31, and 32 is fixed by the uniaxial magnetic anisotropy of the fixed magnetic layers 14, 31, and 32 themselves.

EXAMPLE 1

The product ΔRA of the magnetic resistance variation ΔR and the element area A, when a dual spin valve type magnetic detecting element having the film composition shown below was formed and the at % of Ni in the $Ni_aFe_b$ alloy layer (where a and b are represented by at %, and a+b=100) constituting the free magnetic layer was changed, was investigated.

The dual spin valve type magnetic detecting element included: Substrate/foundation layer Ta (30 Å)/seed layer NiFeCr (50 Å)/antiferromagnetic layer IrMn (70 Å)/fixed magnetic layer [first fixed magnetic layer $Co_{70}Fe_{30}$) (30 Å)/nonmagnetic intermediate layer Ru (9.1 Å)/second fixed magnetic layer CoFe (10 Å)/$Co_2MnGe$ (40 Å)]/nonmagnetic material layer Cu (43 Å)/free magnetic layer CoFe (5 Å)/$Ni_aFe_b$ (90 Å)/CoFe (5 Å)/nonmagnetic material layer Cu (43 Å)/second fixed magnetic layer ($Co_2MnGe$ (40 Å)/CoFe (10 Å)/nonmagnetic intermediate layer Ru (9.1 Å)/first fixed magnetic layer ($Co_{70}Fe_{30}$ (30 Å))/antiferromagnetic layer IrMn (70 Å)/protective layer Ta (200 Å). In addition, the figures in parentheses indicate film thicknesses.

Figure 4:
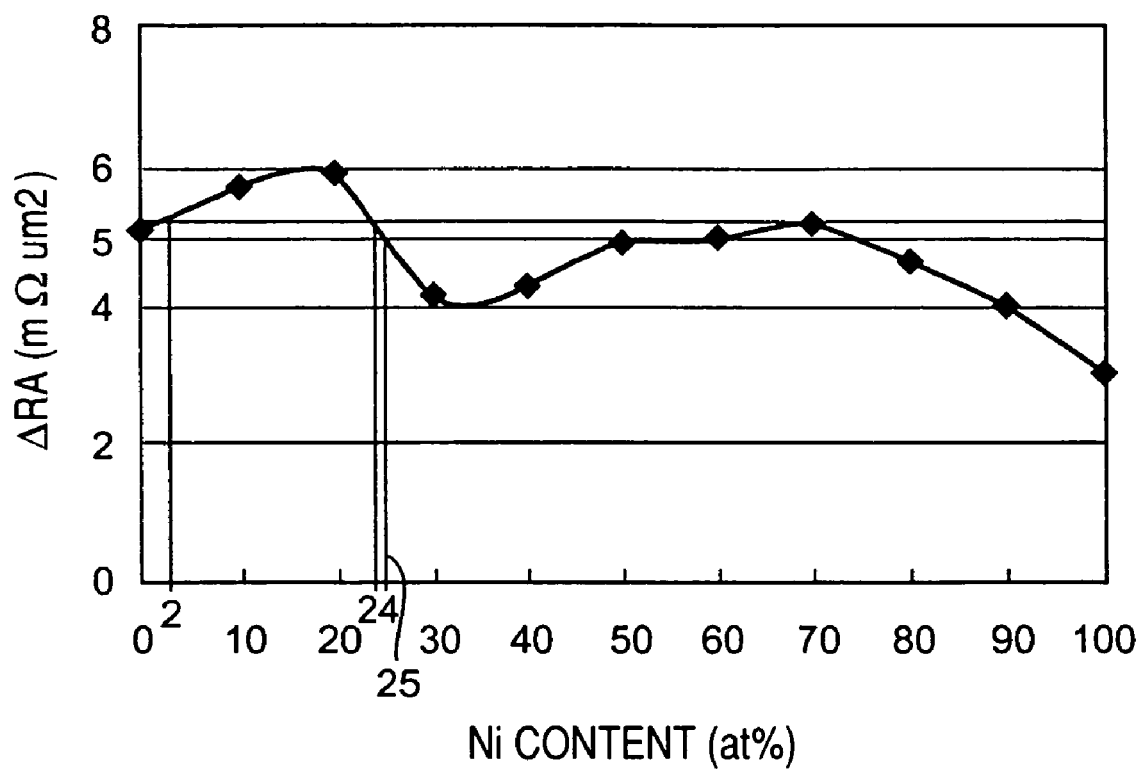
FIG. 4 is a graph showing the product ΔRA of magnetic resistance variation ΔR and element area A when a dual spin valve type magnetic detecting element is formed and the at % of Ni in an $Ni_aFe_b$ alloy layer (where a and b are represented by at %, and a+b=100) constituting a free magnetic layer is changed.
Figure 5:
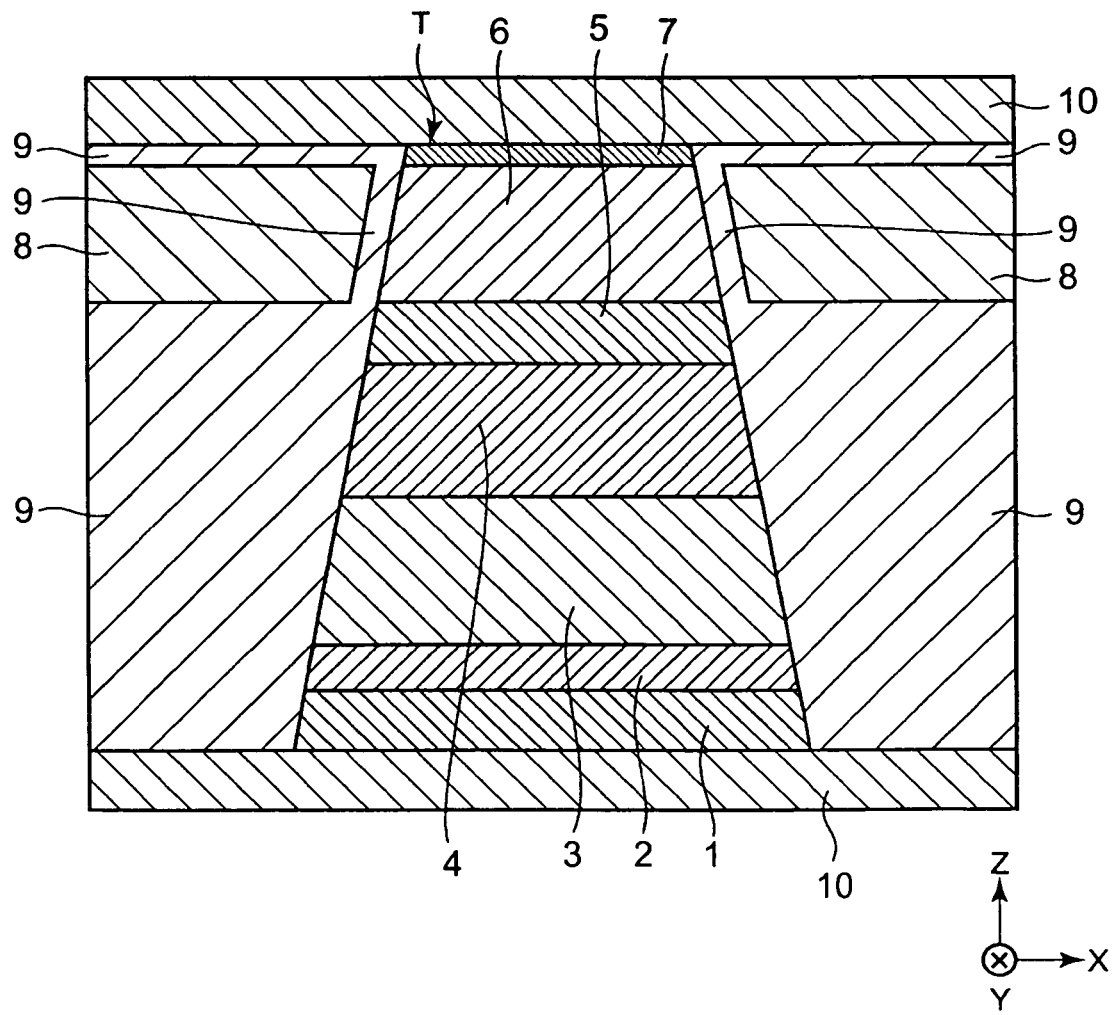
FIG. 5 is a cross-sectional view of a conventional magnetic detecting element.

The results are shown in Table 4. Referring to FIG. 4, if the Ni-content a in the $Ni_aFe_b$ alloy layer (where a and b are represented by at % and a+b=100) of the free magnetic layer is greater than 0 at % and not more than 25 at %, ΔRA of the magnetic detecting element can be 5 mΩμm² or more. It can also be seen that, if the Ni-content a in the $Ni_aFe_b$ alloy layer (where a and b are represented by at % and a+b=100) are 2 at % or more and 24 at % or less, ΔRA of the magnetic detecting element becomes greater than the conventional ΔRA in which the Ni-content a was in the range from 40 at % to 80 at %.

The invention claimed is:

1. A magnetic detecting element comprising:
    a multilayer film provided with a fixed magnetic layer of which a magnetized direction is fixed in one direction and a free magnetic layer formed above the fixed magnetic layer with a nonmagnetic material layer therebetween and allowing a current to flow in a direction perpendicular to a film surface of each layer of the multilayer film,
        wherein the free magnetic layer has an $Ni_aFe_b$ alloy layer (a and b are represented by at %, $0<a\leq25$, and a+b=100).

2. The magnetic detecting element according to claim 1, wherein the free magnetic layer has an $Ni_aFe_b$ alloy layer (a and b are represented by at %, $2\leq a\leq24$, and a+b=100).

3. The magnetic detecting element according to claim 1, wherein the free magnetic layer has a three layer structure in which CoFe layers are laminated on both sides of the $Ni_aFe_b$ alloy layer.

4. The magnetic detecting element according to claim 1, wherein the fixed magnetic layer is a $Co_2YZ$ alloy layer (Y is one or more elements selected from a group consisting of Mn, Fe, and Cr, and Z is one or more elements selected from a group consisting of Al, Ga, Si, Ge, Sn, In, Sb, Pb, and Zn).

5. The magnetic detecting element according to claim 1, wherein the fixed magnetic layer is provided above the free magnetic layer.

6. The magnetic detecting element according to claim 1, wherein the fixed magnetic layer is provided below the free magnetic layer.

7. The magnetic detecting element according to claim 1, wherein the nonmagnetic material layer and the fixed magnetic layer are provided under the free magnetic layer, and another nonmagnetic material layer and another fixed magnetic layer are provided on the free magnetic layer.

8. The magnetic detecting element according to claim 7, wherein an antiferromagnetic layer is superimposed on the fixed magnetic layer.

9. The magnetic detecting element according to claim 1, wherein the free magnetic layer has an $Ni_aFe_b$ alloy layer (a and b are represented by at %, $2<a<24$, and a+b=100).

10. The magnetic detecting element according to claim 1, wherein the free magnetic layer has an $Ni_aFe_b$ alloy layer (a and b are represented by at %, $10\leq a\leq20$, and a+b=100).

* * * * *